United States Patent
Pawlowski

(10) Patent No.: US 9,690,502 B2
(45) Date of Patent: Jun. 27, 2017

(54) SYSTEMS AND METHODS FOR SEGMENTING DATA STRUCTURES IN A MEMORY SYSTEM

(71) Applicant: MICRON TECHNOLOGY, INC., Boise, ID (US)

(72) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 14/726,150

(22) Filed: May 29, 2015

(65) Prior Publication Data

US 2015/0347019 A1   Dec. 3, 2015

Related U.S. Application Data

(60) Provisional application No. 62/006,668, filed on Jun. 2, 2014.

(51) Int. Cl.

| G06F 12/00 | (2006.01) |
|---|---|
| G06F 3/06 | (2006.01) |
| H04L 12/801 | (2013.01) |
| H04L 12/825 | (2013.01) |
| H04L 12/873 | (2013.01) |
| G06F 11/10 | (2006.01) |
| G06F 11/07 | (2006.01) |
| G11C 29/52 | (2006.01) |

(Continued)

(52) U.S. Cl.
CPC ............ *G06F 3/0619* (2013.01); *G06F 3/061* (2013.01); *G06F 3/0604* (2013.01); *G06F 3/0644* (2013.01); *G06F 3/0655* (2013.01); *G06F 3/0659* (2013.01); *G06F 3/0673* (2013.01); *G06F 3/0685* (2013.01); *G06F 3/0688* (2013.01); *G06F 11/076* (2013.01); *G06F 11/1016* (2013.01); *G06F 11/1044* (2013.01); *G06F 11/1068* (2013.01); *G06F 11/1072* (2013.01); *G06F 13/38* (2013.01); *G11C 29/52* (2013.01); *H04L 1/189* (2013.01); *H04L 47/12* (2013.01); *H04L 47/25* (2013.01); *H04L 47/52* (2013.01)

(58) Field of Classification Search
None
See application file for complete search history.

(56) References Cited

U.S. PATENT DOCUMENTS

| 2005/0086374 A1* | 4/2005 | Singh ................. H04L 45/00 709/245 |
|---|---|---|
| 2007/0156946 A1 | 7/2007 | Lakshmanamurthy et al. |

(Continued)

FOREIGN PATENT DOCUMENTS

| TW | 200947444 A | 11/2009 |
|---|---|---|
| WO | 2011071645 A1 | 6/2011 |

OTHER PUBLICATIONS

International Search Report and Written Opinion for PCT Application No. PCT/US2015/033573 mailed on Sep. 3, 2015.

*Primary Examiner* — John A Lane
(74) *Attorney, Agent, or Firm* — Fletcher Yoder, P.C.

(57) ABSTRACT

A memory device may include a memory component that stores data and a processor. The processor may map one or more banks or one or more virtual banks in the memory component based on one or more properties associated with the memory component and an expected random access rate for the memory component.

20 Claims, 6 Drawing Sheets

(51) Int. Cl.
  *H04L 1/18* (2006.01)
  *G06F 13/38* (2006.01)

(56) References Cited

U.S. PATENT DOCUMENTS

| | | |
|---|---|---|
| 2010/0023800 A1 | 1/2010 | Harari et al. |
| 2012/0023365 A1 | 1/2012 | Byom et al. |
| 2012/0113721 A1 | 5/2012 | Kim |
| 2013/0339592 A1* | 12/2013 | Yu .................. G06F 13/1668 |
| | | 711/105 |

* cited by examiner

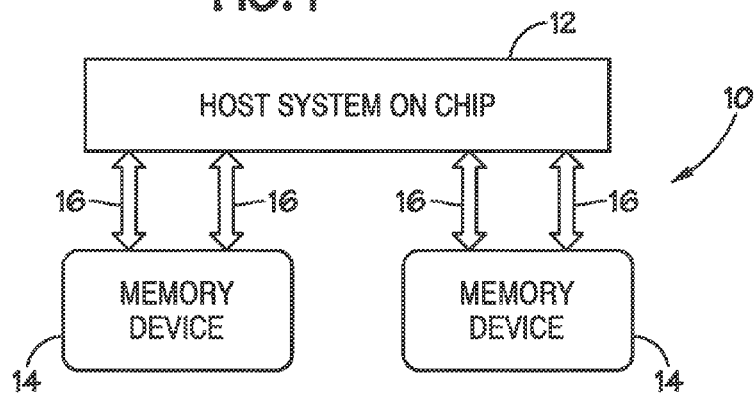
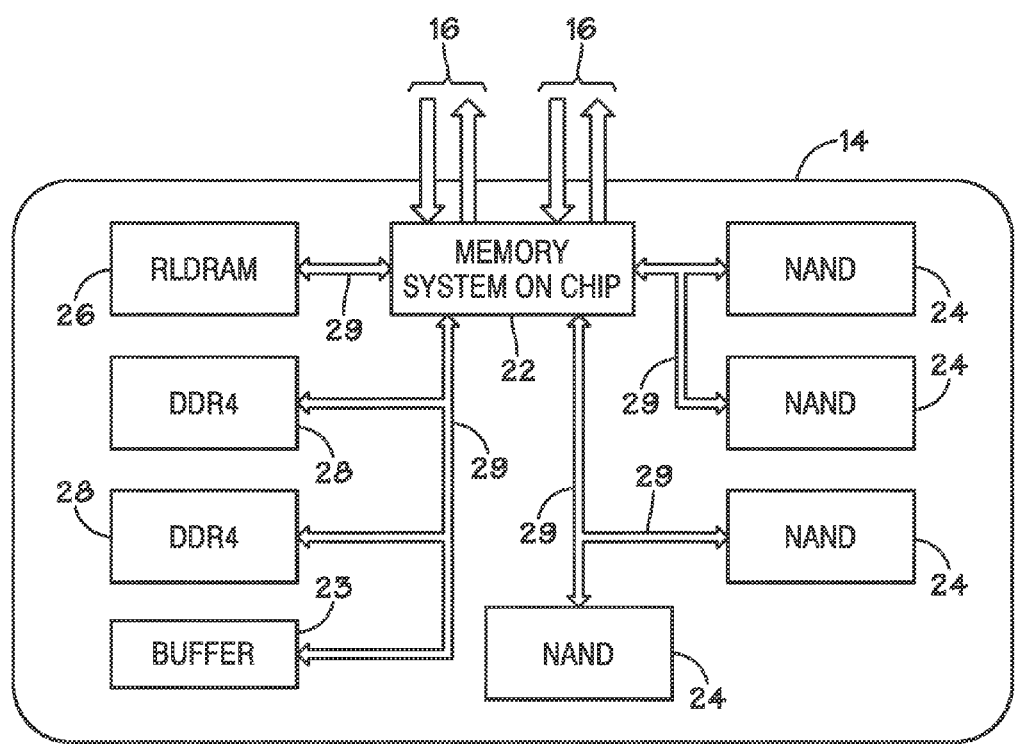

(Physical Stack, Profile View)

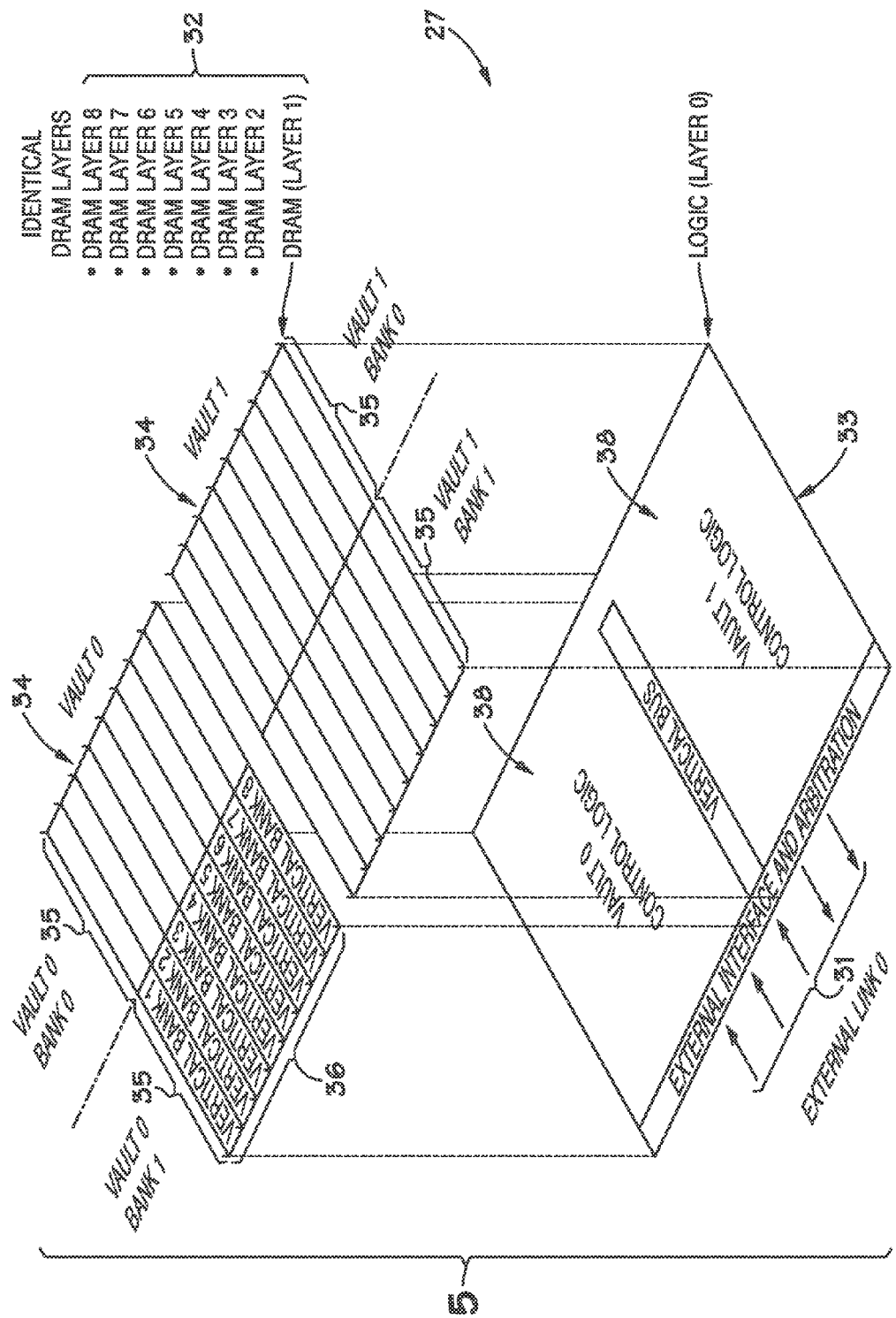

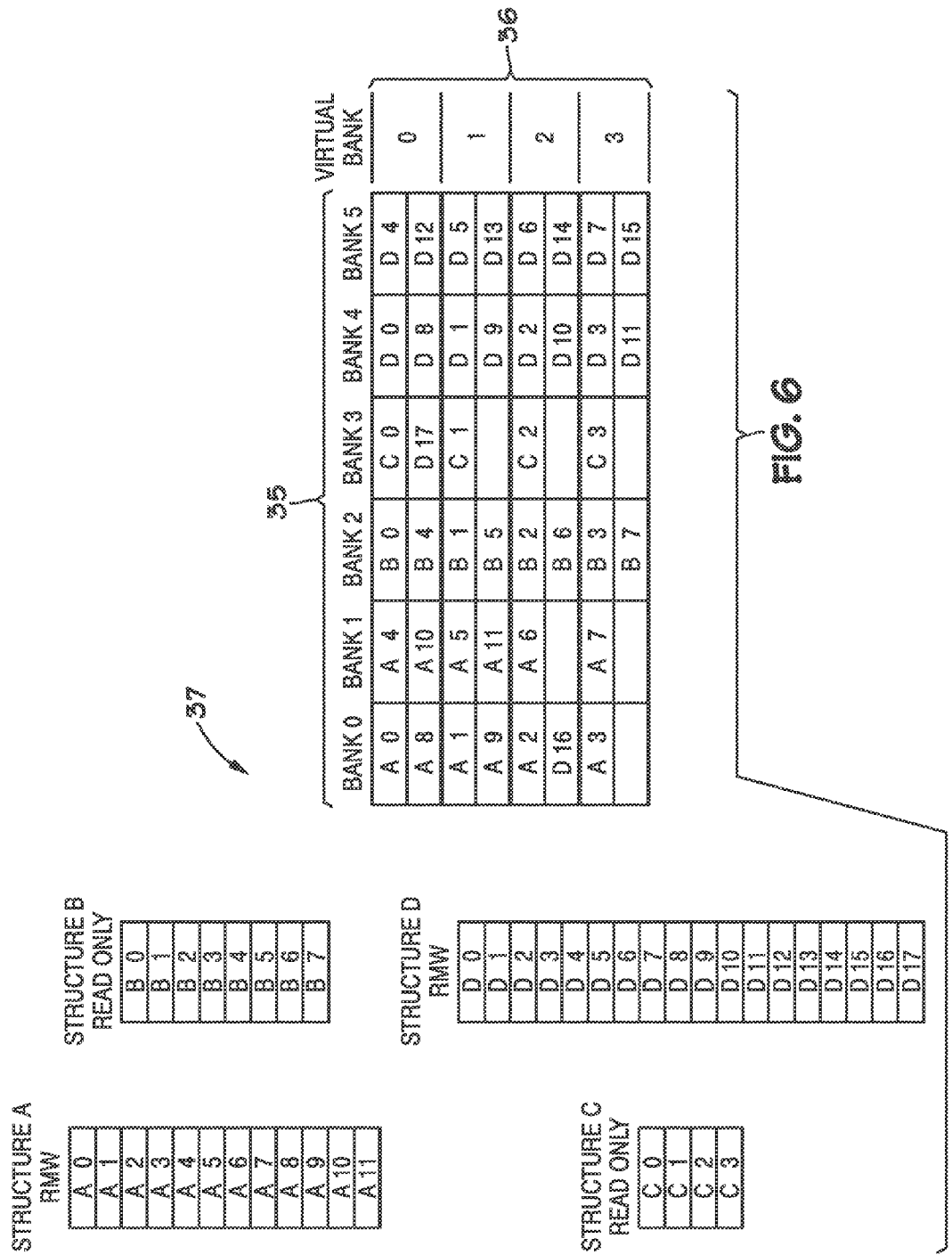

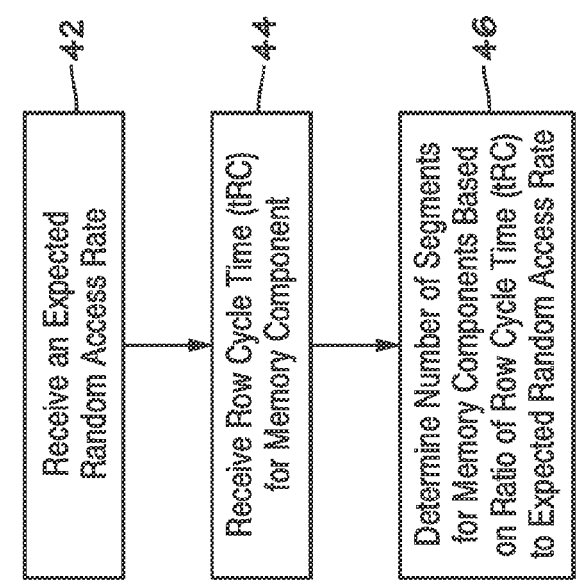
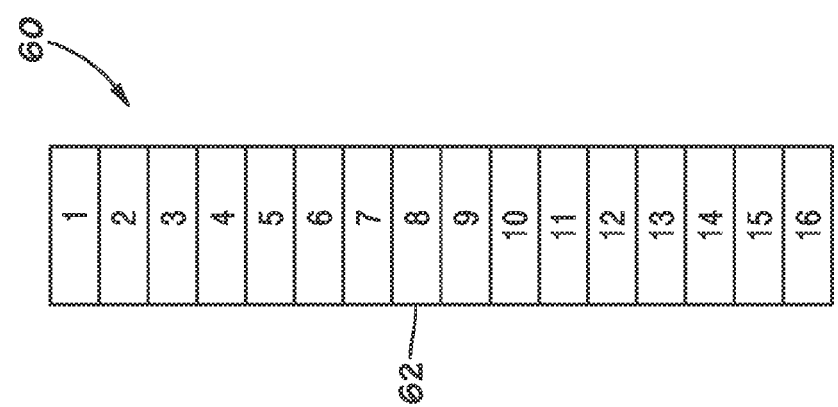
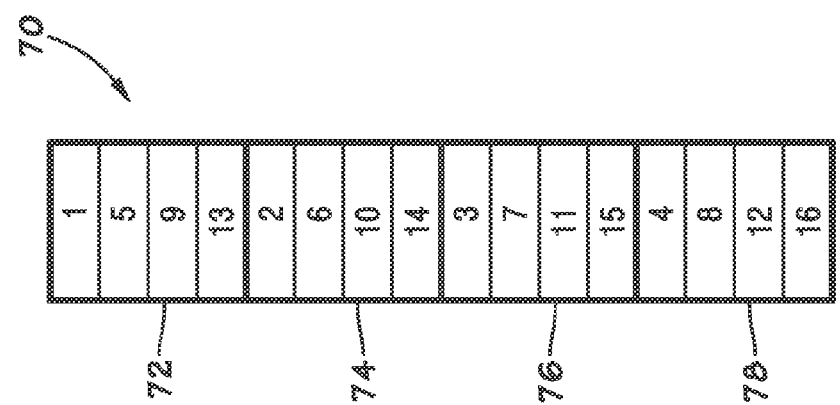

SYSTEMS AND METHODS FOR SEGMENTING DATA STRUCTURES IN A MEMORY SYSTEM

CROSS-REFERENCE TO RELATED APPLICATION

This application is a Non-Provisional Application claiming priority to U.S. Provisional Patent Application No. 62/006,668, entitled "Systems and Methods for a Scalable Memory System Protocol," filed Jun. 2, 2014, which is herein incorporated by reference.

BACKGROUND

1. Field of the Invention

The present disclosure is generally related to a memory system for improving a rate at which data operations (e.g., read, write) may be performed using memory devices. More specifically, the present disclosure is related to systems and techniques for improving rates at which memory systems respond to requests for accessing the memory systems.

2. Description of the Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, low capability (e.g., low request rate) memory types such as a Dynamic Random Access Memory (DRAM) component may be relatively inexpensive as compared to highly capable (e.g., high request rate) memories such as a Static Random Access Memory (SRAM) component. As such, certain data operations (e.g., read, write) may be performed on certain memory types based on the respective capabilities of the memory types. For instance, for large complex data operations involving multiple actions, it may be beneficial to use the SRAM component to ensure that the data operations are performed more quickly as compared to when performing the same data operations using the DRAM component. Although the SRAM component may be used to efficiently perform the requested data operations, SRAM components are typically limited in a memory device due to cost considerations. As such, it may be beneficial to use the less capable memory components or other memory types to perform operations at similar or higher rates as highly capable memory components.

BRIEF DESCRIPTION OF THE DRAWINGS

Various aspects of this disclosure may better be understood upon reading the following detailed description and upon reference to the drawings in which:

FIG. 1 illustrates a block diagram of an example of a computing system, in accordance with an embodiment;

FIG. 2 illustrates a block diagram of an example of a memory device which may be part of the computing system of FIG. 1, in accordance with an embodiment;

FIG. 5 illustrates a schematic diagram of example virtual banks that make up the physical layers of a portion of the memory component of FIG. 3, in accordance with an embodiment;

FIG. 6 illustrates a block diagram of four data structures mapped to virtual banks, in accordance with an embodiment;

FIG. 7 illustrates a flow chart of method for determining a number of virtual banks to create in a memory component of the memory device of FIG. 3, in accordance with an embodiment;

FIG. 8 illustrates a block diagram of an example data structure of a memory component, in accordance with an embodiment;

FIG. 9 illustrates a block diagram of a segmented version of the data structure of FIG. 4, in accordance with an embodiment;

DETAILED DESCRIPTION OF SPECIFIC EMBODIMENTS

Figure 3:
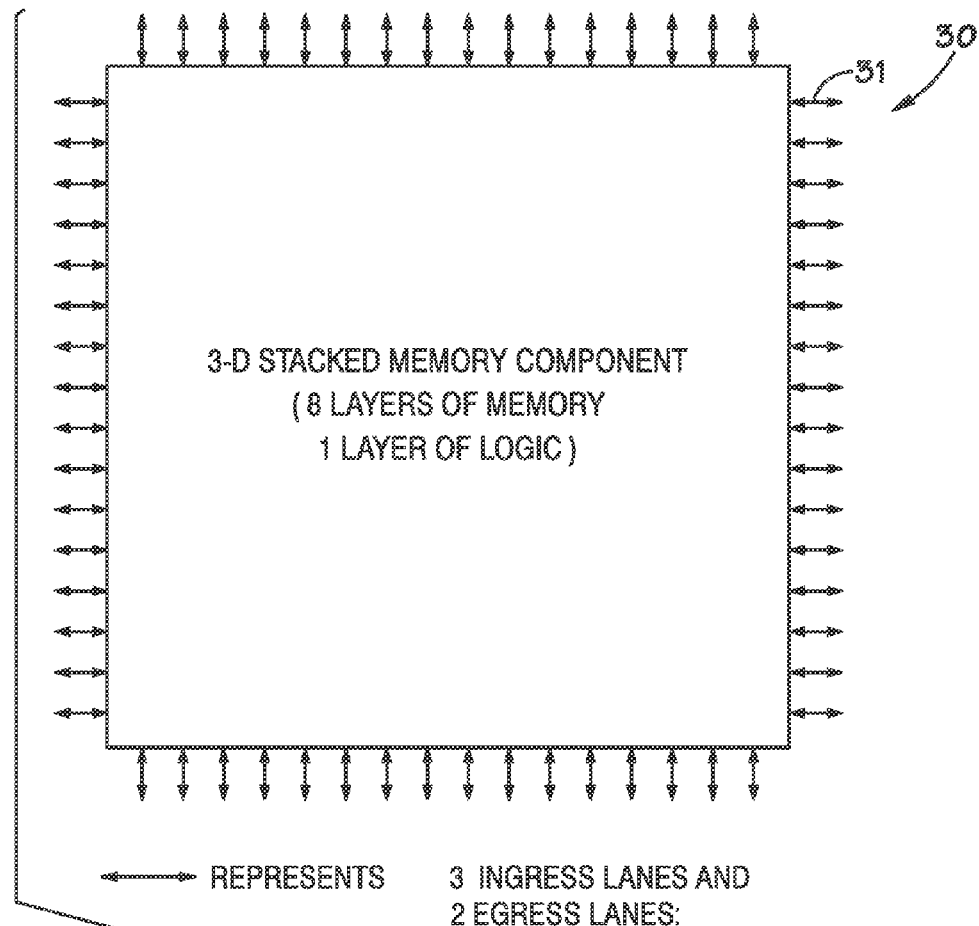
FIG. 3 illustrates a top view of an example three-dimensional stacked memory component that may include a number of memory layers, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally different memory types have different capabilities. That is, different memory types may perform certain types of functions more efficiently than other memory types. For instance, DRAM memory types may not be capable of performing functions as fast as an SRAM memory. In certain embodiments, a memory system may map portions of a DRAM as virtual banks and simultaneously perform multiple operations using the virtual banks As such, operations that may have been individually performed by the SRAM may now be performed using DRAMs. By simultaneously performing these multiple operations in virtual banks of the DRAM, a memory system using the virtual banks may provide an illusion of using a high-request rate memory like SRAM, while using a lower request rate memory (DRAM). As a result, the higher capability memories like SRAM may be reserved for performing other processes. Additional details with regard to mapping virtual banks in various memory types to perform more efficient operations will be described in greater detail below.

Computing and Memory Systems Using the Scalable Protocol

By way of introduction, FIG. 1 illustrates a block diagram of a computing system 10 that may include memory devices that may map virtual banks in memory components in accordance with techniques described herein. The computing system 10 may be any of a variety of computing devices, such as a computer, pager, cellular phone, personal organizer, control circuit, etc. The computing system 10 may include a host system on chip (SoC) 12 that may be coupled to a number of memory devices 14. The host SoC 12 may be an integrated circuit (IC) that integrates all components of a computer or other electronic system into a single chip. As such, the host SoC 12 may include one or more processors, such as a microprocessor, that may control the processing of system functions and requests in the computing system 10. As used herein, processors may include any suitable processor capable of performing executable instructions on a corresponding electrical device.

As mentioned above, the host SoC 12 may be coupled to the memory devices 14. In certain embodiments, the host SoC 12 may be coupled to the memory devices 14 via channels 16. The channels 16 may include buses, electrical wiring, or the like.

FIG. 2 depicts a block diagram of an embodiment of the memory device 14. The memory device 14 may include any electrical storage device designed to retain digital data. The memory device 14 may encompass a wide variety of memory components including volatile memory and non-volatile memory. Volatile memory may include Dynamic Random Access Memory (DRAM) and/or Static Random Access Memory (SRAM). Moreover, the volatile memory may include a number of memory modules, such as single inline memory modules (SIMMs) or dual inline memory modules (DIMMs).

The non-volatile memory may include a read-only memory (ROM), such as an EPROM, and/or flash memory (e.g., NAND) to be used in conjunction with the volatile memory. Additionally, the non-volatile memory may include a high capacity memory such as a tape or disk drive memory. As will be appreciated, the volatile memory or the non-volatile memory may be considered a non-transitory tangible machine-readable medium for storing code (e.g., instructions).

As shown in FIG. 2, in certain embodiments, the memory device 14 may include a system on chip (SoC) 22 that may be a processor-in-memory (PIM) or a computer processor (CPU) tightly coupled to the memory components stored on the memory device 14. Generally, the memory SoC 22 may be on the same silicon chip as the memory components of the memory device 14. By merging the processing and memory components into the memory device 14, the memory SoC 22 may manage the manner in which data requests and responses are transmitted and received between the memory components and the host SoC 12. In certain embodiments, the memory SoC 22 may control the traffic between the memory components to reduce latency and increase bandwidth. As will be appreciated, the host SoC 12 and the memory SoC 22 may employ a scalable memory system protocol when controlling the transmissions between memory components and other devices in accordance with embodiments described herein. As such, the scalable memory system protocol may be operating on the channels 16 between the memory device 14 and the host SoC 12, as well as on channels 29 between the memory components and the memory SoC 22.

By way of example, the memory device 14 may include memory types such as NAND memories 24, Reduced-latency Dynamic random access memory (RLDRAM) 26, double data rate fourth generation synchronous dynamic random-access memory (DDR4) 28, and the like.

In certain embodiments, the host SoC 12 and the memory SoC 22 may perform various operations based on computer-executable instructions provided via memory components, registers, and the like. The memory components or storage may be any suitable articles of manufacture that can serve as media to store processor-executable code, data, or the like. These articles of manufacture may represent computer-readable media (i.e., any suitable form of memory or storage) that may store the processor-executable code used by the host SoC 12 or the memory SoC 22 to perform the presently disclosed techniques. The memory and the storage may also be used to store the data, analysis of the data, and the like. The memory and the storage may represent non-transitory computer-readable media (i.e., any suitable form of memory or storage) that may store the processor-executable code used by the host SoC 12 or the memory SoC 22 to perform various techniques described herein. It should be noted that non-transitory merely indicates that the media is tangible and not a signal.

High Segmentation of Data Structures

As mentioned above, memory devices may be more efficiently used by leveraging the capabilities of certain types of memories to perform operations typically performed on other types of memories. For instance, low capability memory types like DRAM may be relatively inexpensive as compared to highly capable memories such as SRAM. Although the DRAM may not be capable of performing functions as fast as an SRAM, independently operable regions (IORs) of the DRAM, such as banks, may be used to simultaneously perform multiple operations that may have been individually performed by the SRAM. As such, in certain embodiments, the memory SoC 22 may segment data structures of one or more memory components within the memory device 14. That is, the memory SoC 22 may decide how to distribute information using the available data structures of each memory component. It should be mentioned that, as discussed herein, segmenting a data structure generally involves mapping portions of the data structure according to banks already existing in the memory component, into virtual banks of the existing banks, and the like. As will be appreciated, the banks may operate independently of each other given their respective data structures within the memory component. In the same manner, the virtual banks mapped in each bank may operate independently of each other depending on the bank in which each respective virtual bank is mapped. In any case, after determining the available data structures in the memory components, the memory SoC 22 may map different data structures that are part of the memory component into banks or virtual banks of the memory component. As a result, the high segmentation techniques may allow an inexpensive memory with high bank counts such as DRAM (i.e., a DRAM with more banks than a customary DRAM and possible banks segmented to operate as virtual banks not found in a customary DRAM) to displace more expensive and highly capable memory such as SRAM.

With the foregoing in mind, each memory component of the memory device 14 may include a certain number of data structures that may be part of the memory component when it was initially manufactured. For example, a memory component may be a stacked device that includes a number of layers of memory that may be distributed into different parts such as vaults and banks FIG. 3 illustrates a top view of an example three-dimensional stacked memory component 30 that may include a number of memory layers, which may be created at the time of manufacturing. As shown in FIG. 3, the memory component 30 may include a number of links 31 coupled thereto. Generally, the channels 29 discussed above may include one or more links 31 and may provide access to the memory component 30. In the depicted embodiment, each link 31 may include three ingress lanes and two egress lanes.

Figure 4:
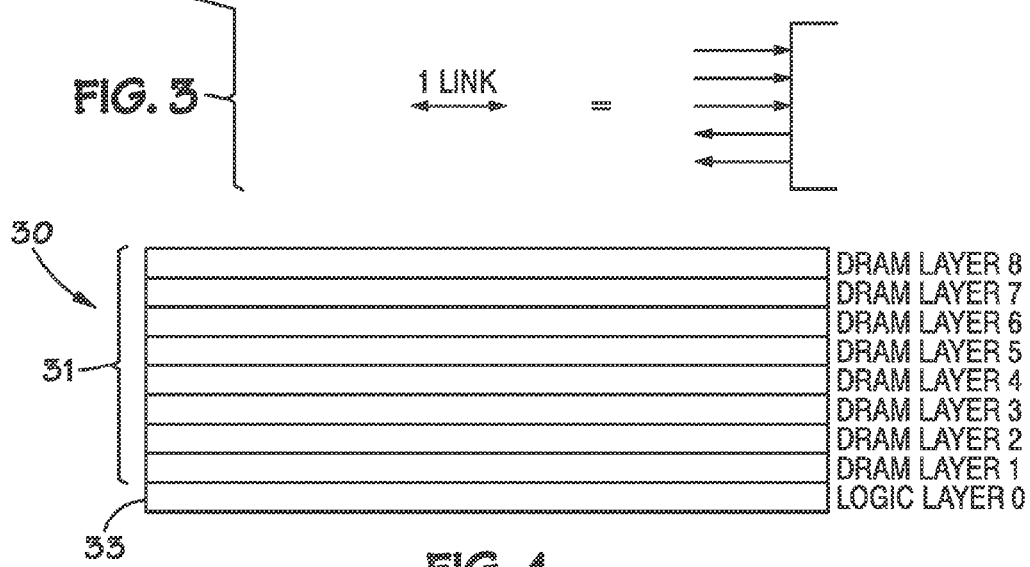
FIG. 4 illustrates a schematic diagram of physical layers of the memory component of FIG. 3, in accordance with an embodiment.

As mentioned above, the memory component 30 may include a number of memory layers and a logic layer. FIG. 4, for instance, illustrates a schematic diagram of the memory component 30 having eight memory layers 32 (e.g., DRAM layers 1-8) and one logic layer 33 (e.g., logic layer 0). Each memory layer 32 may include memory bit cells that may be used to store data. The logic layer 33 may include control circuitry components that may facilitate access to one or more of the memory layers 32 and to an external interface.

As discussed above, the memory component 30 may be segmented at the time of manufacturing to provide separate segments or IORs of the memory component 30. In one example, each memory layer 32 may be separated into large segments (e.g., vaults), which may further be segmented into smaller segments (e.g., banks) According to the techniques described herein, the banks may be further segmented into virtual banks FIG. 5 illustrates a schematic diagram of a portion 27 of the memory component 30 discussed above. As shown in FIG. 5, each memory layer 32 of the portion 27 of the memory component 30 may be segmented into two vaults 34 and each vault 34 may be segmented into two banks 35.

It should be noted that FIG. 5 illustrates a portion 27 of the logic and memory stack pertaining to one of the links 31. In one embodiment, there may be 64 such portions (e.g., slices) for the whole memory component 30. Since each memory layer 32 is segmented into two vaults 34, the logic layer 33 may include two control logic portions 36, which may control the flow of data to each respective vault 34. In the depicted embodiment, the two vaults 34 are illustrated per one external link 31. This configuration may provide an optimization of internal speed capability of DRAM technology and how it matches to the external speed capability of the logic layer 33. However, it should be noted that, in certain embodiments, each vault 34 may include its own individual vertical bus (not shown) coupled to the logic layer. In certain embodiments, each link 31 may access the vaults 34 via the logic layer 33. As such, the logic layer 33 may provide access to any of the memory layers 32.

With this in mind, the memory SoC 22 or any other suitable device may further segment the banks 35 into virtual banks 36 that may be used to provide improved operations of the memory component 30. That is, in certain embodiments, the memory SoC 22 allocate different portions of the segments (e.g., banks 35) of the memory layer 32 as separate virtual banks 36, which may be used to perform various data operations.

By way of example, FIG. 6 illustrates four example data structures 37 that may be part of the memory component 30. As will be appreciated, using the systems and techniques disclosed herein, the memory SoC 22 may map the data structures 37 into virtual banks 36 distributed across banks 35. That is, the memory component 30 may include six banks 36 (banks 0-5) that have been segmented into four virtual banks 36 (virtual banks 0-3). As illustrated in FIG. 6, data structure A and data structure D are read-modify-write (RMW) structures that are mapped into twice as many physical banks as read-only structures. That is, the registers of the RMW structures may each be mapped across two banks 35, as opposed to the read only structures, which may each be mapped across one bank 35. By mapping each structure to different banks 35, the memory SoC 22 may improve the ability of the memory component 30 to handle multiple requests. For example, if a first request involved accessing register A0 of data structure A and a second request involved accessing register A5 of data structure A, the memory SoC 22 may not provide access to the data structure A for the second request until the first request has been processed. However, if the data structures 37 are mapped into the virtual banks 36 illustrated in FIG. 6, since registers A0 and A5 are mapped to different virtual banks 36 that are part of different banks 35, the memory SoC 22 may simultaneously process the first and second requests because they both access different banks 35.

Keeping the example segmented structure of the memory component 30 in mind, techniques for using the high segmentation of memory components will be described below using a network equipment example. However, it should be noted that this same approach may also work when there are no clear data structures. Generally, as mentioned above, by putting the independently operable regions (IORs), like DRAM banks (e.g., banks 35), into low-order bits of an addressing structure, the same system operation effect may be achieved as compared to a segmentation of data structures. For instance, if the DRAM natural access is 128 bits (16 Bytes), the address bit immediately preceding the 16B group may lead to the next IOR. As such, successive random transactions are likely to go to a different IOR than the preceding transaction.

Looking at a network equipment example, in a high-speed router that may support Internet traffic, up to 40 different data structures may be referenced when a packet is received by the router. If the aggregate line rate of incoming data is 400 Gb/s, the minimum packet size is 512 bits, and the additional time gaps around the packet causes the packet duration to be 672 bits, and all packets are the same size, then the packet rate is 1.68ns, or 672 bits/400Gb/s. Some structures may simply be touched (e.g., read or written) once per packet, while other structures may be touched twice (e.g., read and written). As such, to support this line rate, the memory may support a random access rate for 2-touches of 1.68ns/2=0.84ns, which may be difficult for any memory to support this type of random access. Moreover, it may be difficult to design DRAMs to permit a row cycle time (tRC) of 0.84ns or scaling it to an even smaller value of tRC. As used herein, the tRC of a memory component refers to a minimum amount of time (e.g., clock cycles) that a memory row of the memory component takes to complete a full cycle, from row activation to pre-charging of the active row.

To facilitate this type of random access, the number of bank counts of individual DRAMs utilized by the memory SoC 22 may be increased to provide a sufficient number of banks to cover the needs of an application that randomly has an approximate access rate for 2-touches of 0.84ns. In order to determine the number of bank counts of the individual DRAMs, the memory SoC 22 may determine a degree or an amount in which the data structure of a memory component may be used to allow a successful system operation in accordance with the preferred random access request rate. Generally, the amount of segmentation to use may be dependent on a ratio of tRC of the memory component to the preferred random access request rate.

With the foregoing in mind, FIG. 7 illustrates a method 40 for determining a minimum number of segments that the memory SoC 22 may choose to use in a memory component (e.g., DRAM). If the memory component includes less that this minimum number of segments, the segments of the memory component may begin to receive random request that will, at times, tie up each segment, arrive at the same time, and cause various delays. As such, in practice, the number of segments implemented after performing the method 40 may include one or more segments in addition to the calculated minimum. As used herein, segments refer to banks 35 that already exist in the memory component 30. Segments also refer to virtual banks 36 mapped by a processor as described above. In certain embodiments, the memory SoC 22 may perform the method 40 described below prior to using different segments of a respective memory component. However, it should be understood that the method 40 may be performed by any suitable processor. For the purposes of discussion, the following description of the method 40 will be described with respect to virtual banks 36, but it should be understood that the method 40 may also be performed with respect to the banks 35 that are part of the memory component 30.

At block 42, the memory SoC 22 may receive an expected random access rate for packets expected to be transmitted to the memory SoC22. Referring back to the example presented above, if an aggregate line rate of incoming data is 400Gb/s, the minimum packet size is 512 bits (672 bit equivalent including inter-packet gaps), and all packets are the minimum size, then the expected random access rate for each received packet is approximately 1.68ns. Assuming that each packet includes a 2-touch data operation, the expected random access rate for each received packet is approximately 0.84ns.

At block 44, the memory SoC 22 may receive a row cycle time (tRC) for a memory component. As discussed above, the tRC of a memory component refers to a minimum amount of time (e.g., clock cycles) that a memory row of the memory component takes to complete a full cycle, from row activation to pre-charging of the active row. In other words, the tRC of the memory component may refer to an amount of time that a data structure (e.g., bank) in a memory component may use when performing one data operation (e.g., 2-touch operation).

At block 46, the memory SoC 22 may determine a minimum number of virtual banks in the respective memory component that may be used based on a ratio of the tRC of the memory component to the expected random access rate for each received packet. If the tRC of the memory component received at block 44 is 8.4ns, the ratio of the tRC of the memory component to the expected random access rate for each received packet in the above example is 8.4:0.84, or 10 to 1. The resulting ratio between the tRC of the memory component to the expected random access rate for each received packet may correspond to a minimum number of virtual banks to be used in the respective memory component to accommodate the expected random access rate for each received packet. That is, the resulting ratio may identify a number of virtual banks needed in the respective memory component to continuously receive packets without adding packets to a queue.

As mentioned above, the memory component 30 is generally distributed into different structures (e.g., vaults 34, banks 35) at the time of designing or manufacturing the memory component 30. One distribution example includes splitting the memory component 30 into banks 35, as discussed above. The banks 30 may be accessible using shared independent row and column decoders, sense amplifiers, and data paths.

With this in mind, in some embodiments, the memory SoC 22 may use fewer resources to access the memory layers 35 by splitting a bank 35 into virtual banks 36. That is, the memory SoC 22 may map different portions of a bank 35 into a number of virtual banks 36 to enable different banks 35 to operate independently. As such, separate row decoders of the logic layer 33 may be used to access each virtual bank 36 but some commonality of resources can still exist along the respective data path and via of column decoders of the logic layer 33.

By mapping one bank 35 into virtual banks 34, the memory SoC 22 may incur less area penalty (e.g., 2-3% extra) as compared to mapping different banks 35 into part of different vaults 34 or different memory layers 32. That is, a new request can come into this single bank 35 with a number of virtual banks 36 and access each of the virtual banks using shared resources (e.g., column decoder). As such, the memory SoC 22 may service a request at a rate of the column-to-column delay time (tCCD) of ~4ns, which is faster than the row cycle time (tRC) of the whole bank 35 (e.g., ~35ns). Although in some cases the tCCD rate may be slower than the data path capability (e.g., could operate at 1-2ns), using virtual banks 36 may still provide improved speeds in accessing the memory component 30 as compared to conventional systems.

Referring back to block 46, after determining the minimum number of virtual banks to use in the respective memory component, the memory SoC 22 may begin mapping one or more data structures in the respective memory component to a respective virtual bank 36. It should be noted that by designing the memory component 30 to have more banks 35 or adding virtual banks 36 to the banks 35, the memory component 30 may use additional silicon area, which may correlate to a higher cost, and hence a higher cost per bit. As a result, if the die size of the memory component 30 is constant, fewer bits may be available in the memory component 30. However, the process of mapping described herein will not actually cause the loss of any memory capacity (e.g., memory bit count) to decrease. Instead, the mapping techniques described herein may cause data to be spread around the memory component 30. As such, additional logistics may be used in keeping track of memory that is in use and memory that is free.

To better illustrate the benefits of segmenting the memory component, FIG. 8 illustrates an example data structure 60 of a memory component that has not been segmented into virtual banks 36. As shown in FIG. 8, the data structure 60 includes 16 memory addresses 62. When a packet request is received by the respective memory component having the data structure 60, the corresponding data operation of the packet request may cause the data structure to be unavailable for the tRC of the memory component 30. That is, for example, if a first packet request includes a request for element 3 of the data structure 60 and a second packet request includes a request for element 16, the second packet request may not be performed until the first packet request has been completed or until the tRC of the memory component has passed. If the tRC of the memory component has not passed when the second request packet is attempting to access the data structure 60, the memory SoC 22 may be placed in a queue for the respective data structure 60.

FIG. 9 illustrates a segmented data structure 70 having virtual banks 72, 74, 76, and 78. In one embodiment, each entry of the data structure 70 may be numbered in a round robin fashion based on the number of virtual banks 36. For instance, instead of numbering each memory address chronologically as illustrated in the data structure 60 of FIG. 8, element 1 is mapped to virtual bank 72, element 2 is mapped to virtual bank 74, element 3 is mapped to virtual bank 76, element 4 is mapped to virtual bank 78, element 5 is mapped to virtual bank 72, and so forth.

With the foregoing in mind, the value of the segmented data structure 70 will become apparent when applying the example presented above to the segmented data structure 70 of FIG. 9. That is, if the first packet request includes a request for element 3 of the segmented data structure 70, the memory SoC 22 may provide access to the virtual bank 76 of the segmented data structure 70. Since each segmented data structure is part of the same memory component, the tRC of each virtual bank corresponds to the tRC of the memory component. However, unlike the data structure 60, if the second packet request includes a request for element 16, the memory SoC 22 may provide access to the virtual bank 78 regardless of whether the first packet request has stopped accessing the virtual bank 76. As will be appreciated, since the virtual bank 76 and the virtual bank 78 are independent of each other, the memory SoC 22 may provide access to the virtual bank 78 even when the virtual bank 76 is busy performing another operation. As such, the ability of the memory component to efficiently perform data operations using the segmented data structure 70, as opposed to the data structure 60, increases as more virtual banks are generated.

Although the method 40 of FIG. 7 may provide a minimum number of virtual banks to create in the memory component 30, it may be beneficial to add additional virtual banks in the memory component 30 to compensate for various errors, unexpected delays, packets waiting in a queue to access the memory component 30, and the like. For example, considering simulations of the network system described above for $10^{11}$ random request cycles and assuming a baseline SRAM that can receive a request every 1.68ns and no segmentation of the data structures, the queue depth (i.e., how long a new request waits for an answer in a fully pipelined system) may be 1 packet for operations with only 1-touch. For operations with 2-touches, on the other hand, the queue time trends towards infinity. That is, the SRAM can't keep up when each request performs a touch twice. Since every 1.68ns the memory component may receive a two-touch request even though it can process just one-touch operations in that time span, the queue depth increases after each received packet and trends towards infinity. As such, this simulated system cannot function as designed.

Turning now to a few data points from a simulation of the above example using a 4-way data structure segmentation, the maximum queue delay for a device with relative tRC=2*request rate is simulated to be 12. For a relative tRC=3×, the maximum queue delay is simulated to be 31. It may be desirable for a maximum queue delay for a good system operation to be no greater than about 15 based on various properties of the respective memory component. As such, tRC=2× is a reasonable solution for 1-touch to the structure per packet. For 2-touches, the tRC is effectively doubled because 2 operations are required, so tRC=2× would behave as tRC=4×, which would have an unacceptably long queue time in this example.

In a 64-way segmentation and assuming a tRC=8.4ns (i.e., 5× packet rate), the queue depth may be simulated to be 6, which may be acceptable for 1-touch per packet. However, at tRC=10×, which emulates 2-touches per packet, queue depth may be simulated to be 9, which may also be acceptable. Therefore, by employing 64 banks of the respective memory component, which can be cycled at 5× the packet rate, the memory system may keep up with a full line rate even at 2-touches of the memory per incoming packet.

In a 64-way segmentation with tRC=6× (e.g., 10.08ns in this example), the corresponding class of DRAM may be built using fast bank cycling techniques while still using a conventional 1T-1C DRAM cell and conventional sense amplifiers. Here, the queue may be 7 for 1-touch and 10 for 2-touch, both of which are again acceptable. By way of example, if a system of 40 data structures has 14 of structures that are 1-touch (e.g., read-only) structures and 24 that are 2-touch (i.e. read-modify-write) structures, a 16-way segmentation for each of the 14 read-only structures may involve a total of 224 banks As such, the queue in this example would be 13. The remaining 26 structures may be granted 30-way segmentation, thereby consuming 780 banks 35. Here, the 2-touch queue may be 14. The total number of banks 35 involved in this example may then be 224+780=1, 004. If the total number of banks 35 available is 1,024, then 20 banks 35 remain available for other functions. Keeping this in mind, if the system uses 8 DRAMs to achieve a desired memory capacity and bandwidth, each DRAM may use 128 banks 35, which may be higher than an industry standard DRAM but still feasible to design and build at a reasonable cost.

Figure 10:
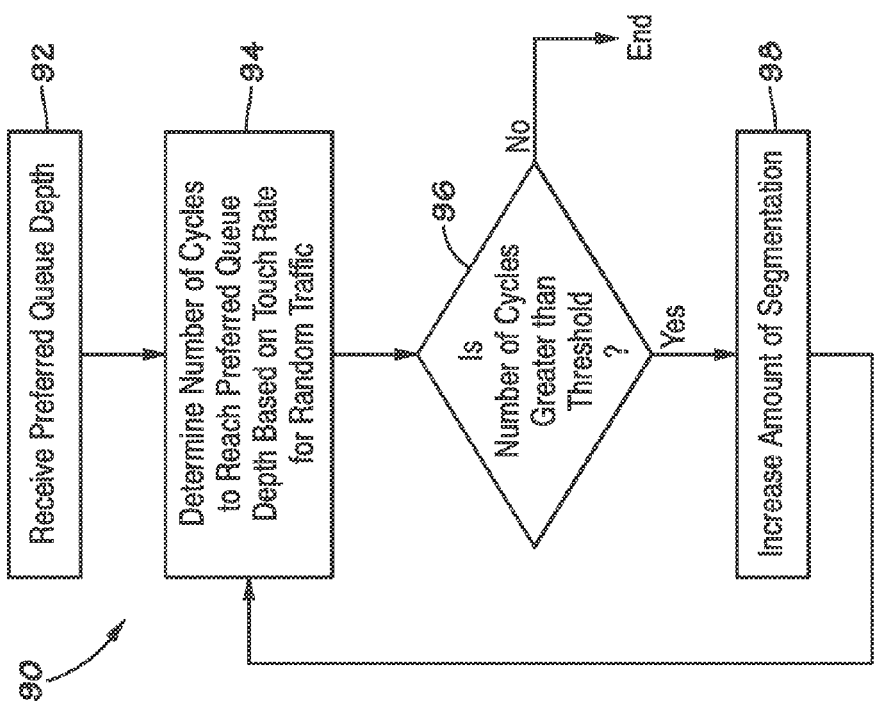
FIG. 10 illustrates a flow chart of a method for determining a number of virtual banks to create in a memory component of the memory device of FIG. 2 based on a preferred queue depth, in accordance with an embodiment.

Although the segmentation of data structures is described here with reference to a network router, it should be understood that the techniques described herein may also be employed in other types of systems. As such, the above examples are not intended to limit the scope of the presently disclosed techniques to networking With the foregoing in mind, FIG. 10 illustrates a method 90 for determining a number of virtual banks to create in the memory component based on a preferred queue depth. As mentioned above with respect to FIG. 7, for the purposes of discussion, the following description of the method 90 will be described with respect to virtual banks 36, but it should be understood that the method 90 may also be performed with respect to the banks 35 that are part of the memory component 30.

In one embodiment, the method 90 may be performed after determining the number of virtual banks 36 to create in the memory component according to the method 40. That is, the method 40 may be used to determine a minimum number of virtual banks 36 to map in the memory component 30 and then the method 90 may be employed to fine tune or identify a number of virtual banks 36 to map in the memory component 30 to efficiently perform various data requests.

Like the method 40, the following description of the method 90 will be discussed as being performed by the memory component SoC 22, but it should be understood that any suitable processor may perform the method 90. Moreover, although the method 90 is presented in a particular order, it should be noted that the method 90 may be performed in any suitable order.

Referring now to FIG. 10, at block 92, the memory SoC 22 may receive a preferred queue depth. The preferred queue depth may be determined based on an amount of memory available after the memory component is segmented. Generally, each queue depth increment involves using an additional register or additional memory in the memory component to store the corresponding data being queued. As such, the preferred queue depth may relate to an amount of memory available in the memory component.

It should be noted that a memory cost is involved with increasing an amount of queue depth that the memory component 30 can support. Increasing the queue depth available to the memory component 30, that is, involves using more registers of the memory component 30 to increase the queue depth. To reduce queue depth, however, the memory SoC 22 may map virtual banks 36 within the memory component 30. However, the mapping of virtual banks 36 still increases memory cost and adds control logic cost on the logic layer 33 to accommodate different queue for different virtual banks 36. However, the relatively longer queue depths of an un-segmented memory component 30 as compared to the segmented memory component 30 corresponds to lower system performance as compared to using multiple queue involved with having virtual banks 36.

At block 94, the memory SoC 22 may determine a number of cycles performed before reaching the preferred queue depth based on for random traffic having some expected touch rate for virtual banks 36 of the memory component 30. In certain embodiments, the expected amount of virtual banks 36 may correspond to the result of the method 40.

Using the random traffic having the expected touch rate for minimum number of virtual banks 36 determined using the method 40, the memory SoC 22 may perform a simulation of the memory component 30 receiving a certain number of random requests. In one embodiment, the memory SoC 22 may perform the simulation until the preferred queue depth has been reached.

Figure 11:
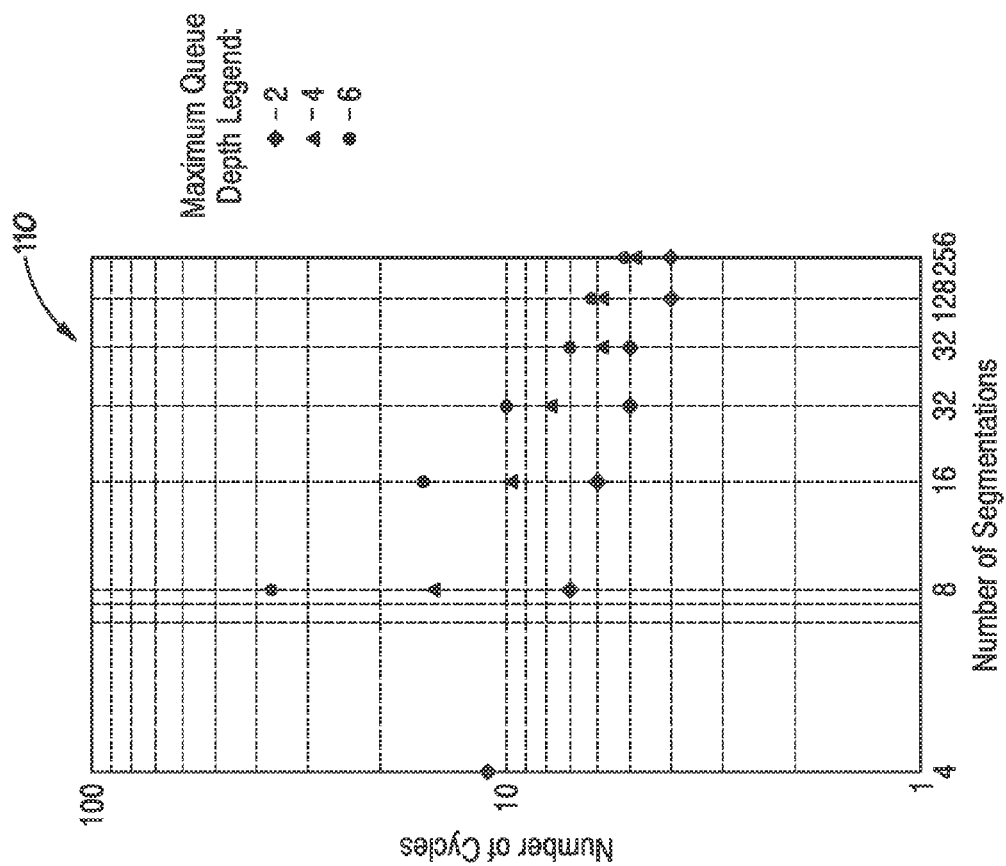
FIG. 11 illustrates a logarithmic graph of a number of virtual banks with respect to various queue depths, in accordance with an embodiment.

By way of example, FIG. 11 illustrates a logarithmic graph 110 illustrating when various queue depth values occur over a number of cycles with respect to a number of virtual banks 36 present in the memory component 30. As shown in the logarithmic graph 110, when the memory component 30 is segmented into 4 virtual banks 36, the maximum queue depth of 2 is reached after 10,000 cycles. With this in mind, at block 94, the memory SoC 22 may use a simulation to determine a number of cycles are expected to be performed before reaching the preferred queue depth.

Referring again to FIG. 10, at block 96, the memory SoC 22 may determine whether the number of cycles is greater than some threshold. In one embodiment, the threshold may be associated with an expected packet error rate of the packets being simulated as traffic. That is, although the number of virtual banks 36 determined by the method 40 described above may provide a sufficient number of virtual banks 36 to perform data operations associated with the received packets, the determined number does not account for packet error rates of the received packets. Any packet may have a packet error rate that reflects an expected number of cycles performed before an error may occur. For example, the packet error rate may be 1 error per $10^9$ cycles. When an error occurs for a packet, the packet is retransmitted and the queue (e.g., queue depth) for the memory component 30 may increase.

With this in mind and considering the random traffic of packets that are part of the simulation, a request packet may repeatedly arrive at the same virtual bank 36 before the previous request packet is finished processing. As such, the request packets may back up or be stored in a register as part of the queue. In certain embodiments, the backlog of request packets may be stored in the queue in front of the memory component 30. However, the size of the queue is limited since each register for holding packets in the queue costs memory space. At some point, the memory space will no longer be available. If the frequency at which the queue resources is eliminated is less than the normal packet drop rate due to packet error, then there may not be any observable loss in the operation of the memory component 30. For instance, if a packet is dropped 1 out of $10^9$ times, the memory component 30 may be selected to include enough registers to support a queue that drops 1 out of $10^{12}$ requests or 0.1% of the normal packet drop rate. As such, referring back to block 96, in some embodiments, the threshold may be some multiple greater than the packet error rate. For example, if 1 packet of $10^{10}$ packets is dropped, the threshold may be set as $10^{12}$.

If the memory SoC 22 determines that the number of cycles is not greater than the threshold, the memory SoC 22 may end the method 90 and proceed with the number of virtual banks used at block 94. If, however, the memory SoC 22 determines that the number of cycles is greater than the threshold, the memory SoC 22 may increase the amount of virtual banks 36 mapped in the memory component 30 and, at block 98, repeat blocks 94-98 until the number of cycles to reach the preferred queue depth is less than the threshold.

Although the method 90 described above is described as being performed by the memory SoC 22, it should be noted that, in certain embodiments, the method 90 may be performed by a processor operating separately from the memory device 14. That is, the processor that performs the method 90 may have additional processing power, as compared to typical memory SoCs, to determine the amount of virtual banks 36 to use more quickly. However, if the method 90 is performed by the memory SoC 22, it should be noted that the memory SoC 22 may include additional control logic, counters, and a random number generator to perform the method 90 efficiently.

While the embodiments described herein may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device, comprising:
    a memory component configured to store data; and
    a processor configured to map one or more banks or one or more virtual banks in the memory component based on one or more properties associated with the memory component and an expected random access rate for the memory component, wherein a first number of the one or more banks or a second number of the virtual banks is determined based on the one or more properties and the expected random access rate.

2. The memory device of claim 1, wherein the memory component comprises a Dynamic Random-Access Memory or a NAND memory.

3. The memory device of claim 1, wherein the processor is configured to perform at least two data operations on the memory component via two distinct virtual banks of the virtual banks, wherein a portion of the at least two data operations are being performed at the same time.

4. The memory device of claim 1, wherein the properties associated with the memory component comprise a row cycle time of the memory component.

5. The memory device of claim 1, wherein the expected random access rate is determined based on an aggregate line rate of requests received by the processor, a minimum size of each request of the requests, and a type of touch operation performed by each request of the requests.

6. A method, comprising:
    receiving, via a processor, an expected random access rate associated with accessing a memory component;

receiving, via the processor, a row cycle time associated with the memory component;

determining, via the processor, a first number of banks or a second number of virtual banks to generate in the memory component based on the expected random access rate and the row cycle time; and mapping, via the processor, one or more banks or one or more virtual banks in the memory component based on the first number of banks or the second number of virtual banks, respectively, wherein each virtual bank of the one or more virtual banks in the memory component is independently accessible based on locations of the one or more virtual banks in the memory component.

7. The method of claim 6, wherein the row cycle time comprises an amount of time for a memory row of the memory component to complete a full cycle.

8. The method of claim 6, wherein the expected random access rate is determined based on a number of touches that is associated with each request to access the memory component.

9. The method of claim 6, wherein determining the number of virtual banks to generate in the memory component comprises determining a ratio of the row cycle time to the expected random access rate.

10. The method of claim 6, comprising accessing, via the processor, a first virtual bank of the one or more virtual banks while a second virtual bank of the one or more virtual banks is also being accessed.

11. The method of claim 6, comprising, mapping, via the processor, a plurality of elements of the memory components to one or more elements in the one or more banks or the one or more virtual banks of the memory components.

12. The method of claim 6, comprising determining, via the processor, the second number of virtual banks to generate in the memory component based on a preferred queue depth for the memory component.

13. The system of claim 12, wherein determining, via the processor, the second number of virtual banks to generate in the memory component based on the preferred queue depth comprises performing a simulation of a plurality of random requests accessing the memory component and determining a number of cycles performed by the processor to reach the preferred queue depth.

14. A tangible, non-transitory, machine-readable medium, comprising instructions configured to:

receive a preferred queue depth for a memory component, wherein the preferred queue depth comprises a number of packets waiting in a queue to access the memory component;

determine a number of cycles to reach the preferred queue depth based on an expected touch rate for a plurality of random packets to be received by the memory component and a first number of banks or a second number of virtual banks in the memory component, wherein each virtual bank of the second number of virtual banks in the memory component is independently accessible based on a location of each virtual bank of the second number of virtual banks in the memory component; and determine a third number of banks or a fourth number of virtual banks in the memory component based on the number of cycles.

15. The tangible, non-transitory, machine-readable medium of claim 14, wherein the instructions to determine the number of cycles comprise instructions to:

perform a simulation of receiving the plurality of random packets by the memory component for the first number of banks or the second number of virtual banks; and determine the number of cycles based on the simulation.

16. The tangible, non-transitory, machine-readable medium of claim 14, wherein the instructions to determine the fourth number of virtual banks comprise instructions to:

determine whether the number of cycles exceeds a threshold; and increase the second number of virtual banks when the number of cycles exceeds the threshold.

17. The tangible, non-transitory, machine-readable medium of claim 16, wherein the threshold is associated with a packet error rate.

18. The tangible, non-transitory, machine-readable medium of claim 17, wherein the packet error rate comprises an expected number of cycles performed before an error occur during a simulation of receiving the plurality of random packets by the memory component.

19. The tangible, non-transitory, machine-readable medium of claim 16, wherein the threshold is a multiple of a packet error rate.

20. The tangible, non-transitory, machine-readable medium of claim 14, wherein the memory component comprises a Dynamic Random-Access Memory or a NAND memory.

* * * * *

UNITED STATES PATENT AND TRADEMARK OFFICE
CERTIFICATE OF CORRECTION

PATENT NO. : 9,690,502 B2  
APPLICATION NO. : 14/726150  
DATED : June 27, 2017  
INVENTOR(S) : J. Thomas Pawlowski Page 1 of 1

It is certified that error appears in the above-identified patent and that said Letters Patent is hereby corrected as shown below:

In the Claims

Column 13, Line 38, Claim 13, delete "The system of claim 12," and insert -- The method of claim 12, --, therefor.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*